United States Patent
Yoon et al.

(10) Patent No.: US 12,392,840 B2
(45) Date of Patent: Aug. 19, 2025

(54) METHOD OF PREDICTING CYCLE LIFE OF SECONDARY BATTERY COMPRISING CARBON BASED HYBRID NEGATIVE ELECTRODE

(71) Applicant: LG ENERGY SOLUTION, LTD., Seoul (KR)

(72) Inventors: Hyo-Jung Yoon, Daejeon (KR); So-Young Kim, Daejeon (KR); Ki-Won Sung, Daejeon (KR); Eun-Ju Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 482 days.

(21) Appl. No.: 17/772,038

(22) PCT Filed: Nov. 4, 2020

(86) PCT No.: PCT/KR2020/015352
§ 371 (c)(1),
(2) Date: Apr. 26, 2022

(87) PCT Pub. No.: WO2021/091236
PCT Pub. Date: May 14, 2021

(65) Prior Publication Data
US 2022/0373610 A1  Nov. 24, 2022

(30) Foreign Application Priority Data
Nov. 4, 2019 (KR) .................. 10-2019-0139765

(51) Int. Cl.
*G01R 31/392* (2019.01)
*H01M 10/42* (2006.01)

(52) U.S. Cl.
CPC ...... *G01R 31/392* (2019.01); *H01M 10/4285* (2013.01)

(58) Field of Classification Search
CPC .................. G01R 31/392; H01M 10/4285
See application file for complete search history.

(56) References Cited

U.S. PATENT DOCUMENTS

| 2009/0155687 | A1* | 6/2009 | Im | H01M 4/48 |
| | | | | 429/231.95 |
| 2011/0039162 | A1* | 2/2011 | Maeda | H01M 4/525 |
| | | | | 429/231.95 |

(Continued)

FOREIGN PATENT DOCUMENTS

| CN | 103137973 A | 6/2013 |
| JP | 2000-212677 A | 8/2000 |

(Continued)

OTHER PUBLICATIONS

Extended European Search Report ('EESR') for Application No. 20885382.0 issued on Nov. 28, 2022.

(Continued)

*Primary Examiner* — Lisa M Caputo
*Assistant Examiner* — Sharah Zaab
(74) *Attorney, Agent, or Firm* — Birch, Stewart, Kolasch & Birch, LLP

(57) ABSTRACT

Disclosed is a method of predicting cycle life of a secondary battery comprising a carbon-based hybrid negative electrode, including: measuring a lattice d-spacing of a carbon based negative electrode active material of a target carbon-based hybrid negative electrode using an X-ray diffractometer during charging/discharging of a target secondary battery, and plotting a graph of changes in lattice d-spacing value as a function of charge/discharge capacity (X axis); calculating a target slope difference corresponding to a difference in slope value changed with respect to an inflection point of the graph during discharging in the plotted graph; comparing the target slope difference with a reference slope difference; and predicting if the cycle life of the target (Continued)

secondary battery is improved compared to the reference secondary battery from a result of the comparison.

11 Claims, 3 Drawing Sheets

(56) References Cited

U.S. PATENT DOCUMENTS

| | | | |
|---|---|---|---|
| 2012/0263977 | A1 | 10/2012 | Furukawa et al. |
| 2014/0199577 | A1* | 7/2014 | Bhavaraju ............. H01M 6/185 429/105 |
| 2014/0295268 | A1 | 10/2014 | Wang et al. |
| 2015/0140359 | A1* | 5/2015 | Park ...................... H01M 4/386 429/218.1 |
| 2017/0352876 | A1 | 12/2017 | Hideaki et al. |
| 2018/0313906 | A1 | 11/2018 | Takahashi et al. |
| 2018/0351208 | A1* | 12/2018 | Shibata ............. C23C 16/45531 |
| 2020/0243920 | A1* | 7/2020 | Yoon ................... G01R 31/389 |

FOREIGN PATENT DOCUMENTS

| | | |
|---|---|---|
| JP | 2003-7354 A | 1/2003 |
| JP | 4900888 B2 | 3/2012 |
| JP | 2017-139089 A | 8/2017 |
| JP | 2019-2887 A | 1/2019 |
| JP | 6487205 B2 | 3/2019 |
| KR | 10-1211327 B1 | 12/2012 |
| KR | 10-1463112 B1 | 11/2014 |
| KR | 10-1488828 B1 | 2/2015 |
| KR | 10-2015-0057483 A | 5/2015 |
| KR | 10-2018-0120589 A | 11/2018 |
| KR | 10-2019-0007966 A | 1/2019 |
| KR | 10-1802482 B1 | 5/2025 |
| WO | WO 2017/081918 A1 | 5/2017 |
| WO | WO 2021/091235 A1 | 5/2021 |

OTHER PUBLICATIONS

Whitehead A H et al: "In situ X-ray diffraction studies of a graphite-based Li-ion battery negative electrode", Journal of Power Sources, Elsevier, Amsterdam, NL, vol. 63, No. 1, Nov. 1, 1996 (Nov. 1, 1996), pp. 41-45, XP004071526, ISSN: 0378-7753, DOI: 10.1016/80378-7753(96)02440-8 *abstract* * Section 3.1* *table 1*.

International Search Report for PCT/KR2020/015352 mailed on Feb. 23, 2021.

Hyun Jung Kwon et al., "Nano/Microstructured Silicon-Carbon Hybrid Composite Particles Fabricated with Corn Starch Biowaste as Anode Materials for Li-Ion Batteries", Nano Letters, 2020, No. 20, pp. 625-635.

Indian Office Action for Indian Application No. 202217027577, dated May 13, 2024, with English translation.

* cited by examiner

METHOD OF PREDICTING CYCLE LIFE OF SECONDARY BATTERY COMPRISING CARBON BASED HYBRID NEGATIVE ELECTRODE

TECHNICAL FIELD

The present disclosure relates to a method of predicting the cycle life of a secondary battery comprising a carbon based hybrid negative electrode.

The present application claims the benefit of Korean Patent Application No. 10-2019-0139765 filed on Nov. 4, 2019 with the Korean Intellectual Property Office, the disclosure of which is incorporated herein by reference in its entirety.

BACKGROUND ART

Recently, with the rapid growth of the market of electric vehicles, robots and energy storage systems, there is a demand for secondary batteries with high energy density, stability, compactness, lightweight and long service life. For large scale applications, it is important to improve the performance of the secondary batteries for higher energy density per weight or volume than the current level of energy density.

Graphite is a negative electrode active material of currently available lithium ion batteries, and it has the limited theoretical capacity of 372 mAh/g (about 160 Wh/kg). As a next-generation negative electrode material of nonaqueous electrolyte secondary batteries, attention is directed to silicon (Si) having the capacity (4200 mAh/g) that is at least 10 times higher than that of graphite. Additionally, it has been proposed to use a variety of non-carbon based materials including silicon showing high theoretical capacity when forming alloy with lithium, as a new material for the negative electrode active material, in place of carbon based materials such as graphite.

However, non-carbon based materials including Si may cause cracks in the electrode and on the electrode surface and splitting failures of the active material due to the high volume expansion rate during alloying with lithium, resulting in the electrical contact reduction and sharp reduction in cycle capacity of secondary batteries. To solve the problem of the non-carbon based materials including Si, many attempts have been made to apply a hybrid negative electrode including a mixture of non-carbon based materials such as non-carbon based materials including Si and carbon based materials.

Despite these attempts, simply mixing the non-carbon based materials with the carbon based materials still has a limitation in improving the cycle life. Accordingly, it is still necessary to design an optimal negative electrode by predicting the cycle life of a secondary battery comprising a hybrid negative electrode.

DISCLOSURE

Technical Problem

The present disclosure is directed to providing a method of predicting the cycle life of a secondary battery comprising a carbon based hybrid negative electrode.

These and other objects and advantages of the present disclosure will be understood by the following description. Meanwhile, it will be easily understood that the objects and advantages of the present disclosure may be realized by the means or method set forth in the appended claims and a combination thereof.

Technical Solution

To solve the above-described problem of the present disclosure, according to an aspect of the present disclosure, there is provided a method of predicting the cycle life of a carbon-based hybrid negative electrode of the following embodiment.

According to a first embodiment, there is provided a method of predicting the cycle life of a secondary battery comprising a carbon-based hybrid negative electrode, the method comprising: measuring a lattice d-spacing of a carbon based negative electrode active material of a target carbon-based hybrid negative electrode using an X-ray diffractometer during charging/discharging of a target secondary battery comprising the target carbon-based hybrid negative electrode comprising a carbon based negative electrode active material and a non-carbon based negative electrode active material, and plotting a graph of changes in lattice d-spacing value as a function of charge/discharge capacity (X axis); calculating a target slope difference corresponding to a difference in slope value changed with respect to an inflection point of the graph during discharging in the plotted graph; comparing the target slope difference with a reference slope difference corresponding to a difference in the slope value changed with respect to an inflection point in a graph showing changes in lattice d-spacing value as a function of charge/discharge capacity (X axis) of a reference secondary battery; and predicting if the cycle life of the target secondary battery is improved compared to the reference secondary battery from a result of the comparison.

According to a second embodiment, in the first embodiment, the reference slope difference may be obtained by measuring a lattice d-spacing of a carbon based negative electrode active material of the reference carbon-based hybrid negative electrode using an X-ray diffractometer during charging/discharging of the reference secondary battery comprising a reference carbon-based hybrid negative electrode comprising the carbon based negative electrode active material and a non-carbon based negative electrode active material, and plotting a graph of changes in lattice d-spacing value as a function of charge/discharge capacity (X axis); and calculating the reference slope difference corresponding to the difference in slope value changed with respect to the inflection point of the graph during discharging in the plotted graph.

According to a third embodiment, in the first or second embodiment, the discharge capacity after the inflection point of the graph during discharging in the plotted graph may correspond to capacity contribution of the non-carbon based negative electrode active material, and the discharge capacity before the inflection point may correspond to capacity contribution of the carbon based negative electrode active material.

According to a fourth embodiment, in any one of the first to third embodiments, the target slope difference and the reference slope difference may be calculated by the following equation:

Target slope difference=Absolute value of [(the slope of the graph before the inflection point in the graph of the target secondary battery)−(the slope of the graph after the inflection point in the graph of the target secondary battery)]

Reference slope difference=Absolute value of [(the slope of the graph before the inflection point in the graph of the reference secondary battery)–(the slope of the graph after the inflection point in the graph of the reference secondary battery)]

According to a fifth embodiment, in any one of the first to fourth embodiments, it may be determined that the cycle life of the target secondary battery is improved compared to the reference secondary battery when the target slope difference is larger than the reference slope difference from a result of the comparison.

According to a sixth embodiment, in any one of the first to fifth embodiments, it may be determined that the cycle life of the target secondary battery is degraded compared to the reference secondary battery when the target slope difference is smaller than the reference slope difference from a result of the comparison.

According to a seventh embodiment, in any one of the first to sixth embodiments, the carbon based negative electrode active material may comprise at least one of natural graphite, artificial graphite, soft carbon, hard carbon, pitch carbide, sintered cokes, graphene, or carbon nano tubes.

According to an eighth embodiment, in any one of the first to seventh embodiments, the non-carbon based negative electrode active material may comprise a metal or metalloid that can form an alloy with lithium.

According to a ninth embodiment, in any one of the first to eighth embodiments, the non-carbon based negative electrode active material may comprise a metal or metalloid selected from Si, Sn, In, Pb, Ga, Ge, Al, Bi, Sb, Ag, Mg, Zn, Pt, Ti or a combination thereof; their oxide; their carbon composite; a carbon composite of the metal or metalloid oxide; or a mixture thereof.

According to a tenth embodiment, in any one of the first to ninth embodiments, the non-carbon based negative electrode active material may comprise Si, $SiO_x$ (0<x<2), or a mixture thereof.

Advantageous Effects

According to an embodiment of the present disclosure, it is possible to predict if a target secondary battery comprising a target hybrid negative electrode, whose cycle life is to be predicted, has an improved cycle life over a reference secondary battery comprising a reference hybrid negative electrode, as a result of separating the singular behaviors of the non-carbon based material from the combined behaviors of the non-carbon based material by observing a change in the lattice d-spacing of the carbon based material as a function of the charge/discharge capacity (X axis) during the charge and discharge of the full cell secondary battery having the carbon based hybrid negative electrode including the carbon based material and the non-carbon based material by the non-destructive analysis method.

BRIEF DESCRIPTION OF THE DRAWINGS

The accompanying drawings illustrate preferred embodiments of the present disclosure, and together with the following detailed disclosure, serve to help the understanding of the technical aspect of the present disclosure, and thus the present disclosure should not be interpreted as being limited thereto. Meanwhile, the shape, size, scale or proportion of the elements in the drawings may be exaggerated to put emphasis on clearer description.

DETAILED DESCRIPTION

Figure 1A:
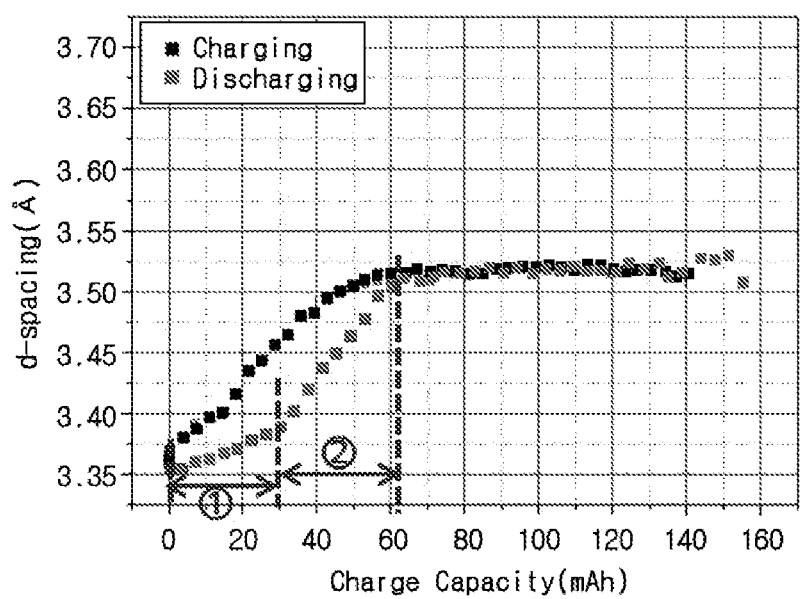
FIGS. 1a and 1b are graphs showing the results of observing in real time changes in lattice d-spacing of artificial graphite included in each negative electrode with changes in capacity during the charge/discharge of sample A (a reference secondary battery) of preparation example 1 and sample B (a target secondary battery) of preparation example 2.

It should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation. Therefore, the configuration shown in the embodiments described herein is just a most preferred embodiment of the present disclosure, but not intended to fully describe the technical aspects of the present disclosure, so it should be understood that a variety of other equivalents and modifications could have been made thereto at the time that the application was filed.

In the present disclosure, a method of predicting the cycle life of a target secondary battery is a method of determining whether the cycle life of the target secondary battery is improved or degraded compared to a particular existing secondary battery, not a method of predicting the absolute value of the cycle life of the target secondary battery.

Here, the particular existing secondary battery used as a reference for cycle life comparison is referred to as a 'reference secondary battery', and in this instance, a carbon-based hybrid negative electrode of the reference secondary battery is referred to as a 'reference carbon-based hybrid negative electrode'.

The secondary battery intended to predict the cycle life compared to the reference secondary battery is referred to as a 'target secondary battery', and in this instance, a carbon-based hybrid negative electrode of the target secondary battery is referred to as a 'target carbon-based hybrid negative electrode'.

The present disclosure is developed to predict the cycle life of a target secondary battery comprising a target hybrid negative electrode compared to a reference secondary battery comprising a reference hybrid negative electrode according to the degree of a lattice d-spacing decreasing slope at the late stage of discharge after an inflection point at which the lattice d-spacing of a carbon-based negative electrode active material included in the negative electrode rapidly changes with changes in capacity while observing the lithiation and delithiation behaviors of a carbon based material and a non-carbon based material during charging/discharging of the secondary battery having the carbon based hybrid negative electrode in a charging/discharging environment.

Another cycle life prediction method according to an embodiment of the present disclosure may be performed by directly observing the behaviors of a mixed electrode of a carbon based material and a non-carbon based material by operando analysis during the charge/discharge of a secondary battery having a carbon based hybrid negative electrode, by a non-destructive analysis method using a full-cell secondary battery.

A secondary battery using a carbon based negative electrode active material alone does not have competitive lithiation and delithiation of lithium ions in the negative electrode active material. However, deceleration/acceleration of lithiation and delithiation of lithium ions is observed in a hybrid negative electrode including both a carbon based negative electrode active material and a non-carbon based negative electrode active material due to competitive reactions of lithiation and delithiation of lithium ions in the carbon based negative electrode active material with the non-carbon based negative electrode active material according to the reaction voltage.

An increase or decrease in the lattice d-spacing of a carbon layer of the carbon based negative electrode active material reflects such a change. Through this, it is possible to predict the secondary battery (the target secondary battery) comprising the target hybrid negative electrode for cycle life compared to the secondary battery (the reference secondary battery) comprising the reference hybrid negative electrode as a reference of comparison by observing the behaviors of the carbon based negative electrode active material and the non-carbon based negative electrode active material in the hybrid negative electrode, and detecting the level of stress (the level of resistance of an electric current, etc.) applied to the carbon based negative electrode active material.

A method of predicting the cycle life of a secondary battery comprising a carbon based hybrid negative electrode according to an aspect of the present disclosure includes:

plotting a graph of changes in the lattice d-spacing value as a function of charge/discharge capacity (X axis) by measuring the lattice d-spacing of a carbon based negative electrode active material in a target carbon based hybrid negative electrode using an X-ray diffractometer during the charge/discharge of a target secondary battery having the target carbon based hybrid negative electrode including the carbon based negative electrode active material and a non-carbon based negative electrode active material;

calculating a target slope difference corresponding to a difference of slope value changed with respect to the inflection point of the graph during discharging in the plotted graph;

comparing the target slope difference with a reference slope difference corresponding to a difference of slope value changed with respect to an inflection point in a graph showing changes in lattice d-spacing value as a function of charge/discharge capacity (X axis) of the reference secondary battery; and predicting if the cycle life of the target secondary battery is improved compared to the reference secondary battery from a result of the comparison.

The carbon based hybrid negative electrode refers to a negative electrode including not only the carbon based negative electrode active material but also the non-carbon based negative electrode active material as the negative electrode active material.

The carbon based negative electrode active material includes any type of carbon based material that allows lithiation and delithiation during charging/discharging of the battery, and is not limited to a particular type. The carbon based negative electrode active material may include amorphous carbon, crystalline carbon, or a mixture thereof. Specifically, the carbon based negative electrode active material may include at least one of natural graphite, artificial graphite, soft carbon, hard carbon, pitch carbide, sintered cokes, graphene, or carbon nano tubes. In particular, graphite is a negative electrode material commonly in lithium secondary batteries, and when mixed with silicon to manufacture an electrode, graphite stably ensures its capacity, has good initial efficiency, and can compensate for the low initial efficiency of the silicon-based negative electrode material. Since these advantages contribute to the increase in initial efficiency of the electrode, graphite-based materials such as artificial graphite or natural graphite are desirable.

The non-carbon based negative electrode active material includes any material that can form an alloy with lithium, and is not limited to a particular type. Specifically, the non-carbon based negative electrode active material may include a metal or metalloid selected from Si, Sn, In, Pb, Ga, Ge, Al, Bi, Sb, Ag, Mg, Zn, Pt, Ti or a combination thereof an oxide of the metal or metalloid such as $SiO_x$ ($0<x<2$), SnO, $SnO_2$, $TiO_2$; a carbon composite of the metal or metalloid; a carbon composite of the metal or metalloid oxide, or a mixture thereof.

According to an embodiment of the present disclosure, the non-carbon based negative electrode active material may include Si, $SiO_x$($0<x<2$), or a mixture thereof.

The carbon based hybrid negative electrode according to an embodiment of the present disclosure may be prepared by coating a mixture of the negative electrode active material including the carbon based negative electrode active material and the non-carbon based negative electrode active material, a conductive material and a binder on a negative electrode current collector and drying, and if necessary, the mixture may further include fillers.

In an embodiment of the present disclosure, the current collector is generally 3 to 500 μm in thickness. The current collector may include, without limitation, any type having high conductivity while not causing a chemical change to the corresponding battery, and for example, stainless steel, aluminum, nickel, titanium, sintered carbon, or aluminum or stainless steel surface-treated with carbon, nickel, titanium and silver. They may be appropriately selected and used depending on the polarity of the positive electrode or the negative electrode.

The binder helps the bonding between the active material and the conductive material and the bonding to the current collector, and is generally added in an amount of 1 to 50 weight % based on the total weight of the electrode material. The binder may include the high molecular weight polyacrylonitrile-acrylic acid copolymer, but is not limited thereto. In another example, the binder may include polyvinylidene fluoride, polyvinylalcohol, carboxymethylcellulose (CMC), starch, hydroxypropylcellulose, regenerated cellulose, polyvinylpyrrolidone, tetrafluoroethylene, polyethylene, polypropylene, ethylene-propylene-diene ter polymer (EPDM), sulfonated EPDM, styrene-butadiene rubber (SBR), polyacrylate, alkali cation or ammonium ion substituted polyacrylate, alkali cation or ammonium ion substituted poly(alkylene-co-maleic anhydride), alkali cation or ammonium ion substituted poly(alkylene-co-maleic acid), polyethylene oxide, fluorine rubber, or a mixture thereof. More specifically, the alkali cation substituted polyacrylate may include lithium-polyacrylate (Li-PAA), and the alkali cation substituted poly(alkylene-co-maleic anhydride) may include lithium substituted polyisobutylene-maleic anhydride.

The conductive material may include any type of material that does not cause a chemical change to the battery, and for example, graphite such as natural graphite or artificial graphite; carbon black such as carbon black, acetylene black, ketjen black (trade name), carbon nano tubes, carbon nano fiber, channel black, furnace black, lamp black, thermal black, conductive fiber such as carbon fiber or metal fiber, metal powder such as fluorocarbon, aluminum, nickel powder; conductive whiskers such as zinc oxide, potassium titanate, conductive metal oxide such as titanium oxide; conductive materials such as polyphenylene derivatives.

According to an embodiment of the present disclosure, when preparing the negative electrode by coating the mixture of the negative electrode active material including the carbon based negative electrode active material and the non-carbon based negative electrode active material, the conductive material and the binder on the negative electrode current collector, the negative electrode may be prepared by a dry method including directly coating a solid mixture including the negative electrode active material, the conductive material and the binder, and a wet method including adding the negative electrode active material, the conductive material and the binder to a dispersion medium, stirring, coating in the form of a slurry and drying to remove the dispersion medium. In this instance, the dispersion medium used in the wet method may include an aqueous medium such as water (deionized water), or an organic medium such as N-methyl-2-pyrrolidone (NMP) and acetone.

The secondary battery according to an embodiment of the present disclosure includes the carbon based hybrid negative electrode, a positive electrode, and a separator interposed between the positive electrode and the negative electrode.

The positive electrode may be prepared by coating a mixture of a positive electrode active material, a conductive material and a binder on a positive electrode current collector and drying, and if necessary, the mixture may further include fillers.

The positive electrode active material may include layered compounds such as lithium cobalt oxide ($LiCoO_2$), lithium nickel oxide ($LiNiO_2$) or compounds with one or more transition metal substitution; lithium manganese oxide of $Li_{1+x}Mn_{2-x}O_4$ (x=0~0.33), $LiMnO_3$, $LiMn_2O_3$, $LiMnO_2$; lithium copper oxide ($Li_2CO_2$); vanadium oxide such as $LiV_3O_8$, $LiFe_3O_4$, $V_2O_5$, $Cu_2V_2O_7$; Ni-site type lithium nickel oxide represented by formula $LiNi_{1-x}M_xO_2$ (M=Co, Mn, Al, Cu, Fe, Mg, B or Ga, x=0.01~0.3); lithium manganese composite oxide represented by formula $LiMn_{2-x}M_xO_2$ (M=Co, Ni, Fe, Cr, Zn or Ta, x=0.01~0.1) or $Li_2Mn_3MO_8$ (M=Fe, Co, Ni, Cu or Zn); $LiMn_2O_4$ with partial substitution of alkali earth metal ion for Li in Formula; disulfide compounds; $Fe_2(MoO_4)_3$, but is not limited thereto.

For the conductive material, the current collector and the binder of the positive electrode, reference may be made to the above description of the negative electrode. The separator is interposed between the positive electrode and the negative electrode, and includes an insulating thin film having high ion permittivity and mechanical strength. The separator generally has a pore size of 0.01~10 μm, and is generally 5~300 μm in thickness. The separator includes, for example, a film, a sheet or a non-woven fabric made of olefin-based polymers with chemical resistance and hydrophobic property such as polypropylene; glass fibers or polyethylene. Meanwhile, the separator may further include a porous layer including a mixture of inorganic particles and a binder resin on the outermost surface.

In an embodiment of the present disclosure, the electrolyte solution includes an organic solvent and a predetermined amount of lithium salt, and the organic solvent includes, for example, propylene carbonate (PC), ethylene carbonate (EC), butylene carbonate (BC), diethylcarbonate (DEC), dimethylcarbonate (DMC), dipropylcarbonate (DPC), methyl propionate (MP), dimethylsulfoxide, acetonitrile, dimethoxyethane, diethoxyethane, tetrahydrofurane, N-methyl-2-pyrrolidone (NMP), ethylmethylcarbonate (EMC), vinylenecarbonate (VC), gamma butyrolactone (GBL), fluoroethylene carbonate (FEC), methyl formate, ethyl formate, propyl formate, methyl acetate, ethyl acetate, propyl acetate, pentyl acetate, methyl propionate, ethyl propionate, butyl propionate, or a mixture thereof. Halogen derivatives of the organic solvent may be used, and linear esters may be used. The lithium salt may include materials that dissolve well in the nonaqueous electrolyte, and for example, LiCl, LiBr, LiI, $LiClO_4$, $LiBF_4$, $LiB_{10}Cl_{10}$, $LiPF_6$, $LiCF_3SO_3$, $LiCF_3CO_2$, $LiAsF_6$, $LiSbF_6$, $LiAlCl_4$, $CH_3SO_3Li$, $(CF_3SO_2)_2NLi$, chloro borane lithium, lower aliphatic carboxylic acid lithium, lithium tetraphenyl borate and imide.

The secondary battery according to an embodiment of the present disclosure may be manufactured by receiving an electrode assembly including the positive electrode and the negative electrode stacked in an alternating manner together with the separator in a packaging such as a battery case together with the electrolyte solution, followed by sealing. A method for manufacturing the secondary battery may include any common method without limitation.

According to an embodiment of the present disclosure, there are provided a battery module including the secondary battery as a unit cell and a battery pack including the same. As the battery module and the battery pack include the secondary battery showing rapid charge characteristics at high loading, they may be used as a power source of electric vehicles, hybrid electric vehicles, plug-in hybrid electric vehicles and energy storage systems.

Meanwhile, for battery components not described herein, for example, a conductive material, reference may be made to the description of components commonly used in the field of batteries, especially, lithium secondary batteries.

In the life prediction method of the present disclosure, first, during the charge/discharge of a target secondary battery comprising a target carbon based hybrid negative electrode including a carbon based negative electrode active material and a non-carbon based negative electrode active material, the lattice d-spacing of the carbon based negative electrode active material of the target carbon based hybrid negative electrode is measured using an X-ray diffractometer, and a graph of changes in lattice d-spacing value as a function of charge/discharge capacity (X axis) is plotted.

According to an embodiment of the present disclosure, during the charge/discharge of the target secondary battery, scanning may be performed while tracking (002) lattice interface peak (2θ=7.5~11 (Ag 2λ=0.56)) of the carbon based negative electrode active material (for example, graphite) included in the target carbon based hybrid negative electrode of the target secondary battery. The lattice d-spacing of the carbon based negative electrode active material may be calculated by fitting the (002) lattice interface peak of the carbon based negative electrode active material included in the negative electrode obtained by scanning (for details of an example of application, see FIGS. 1a and 1b).

A difference in slope value changed with respect to an inflection point (an inflection point at which the absolute value of the slope changes from a large value to a small value) of the slope of the graph during discharging in the plotted graph is calculated.

Subsequently, a target slope difference is compared with a reference slope difference corresponding to a difference of slope value changed with respect to an inflection point in a graph showing changes in lattice d-spacing value as a function of charge/discharge capacity (X axis) of a reference secondary battery.

According to an embodiment of the present disclosure, the reference slope difference may be obtained by:

measuring a lattice d-spacing of a carbon based negative electrode active material of a reference carbon-based hybrid negative electrode during charging/discharging of a reference secondary battery comprising the reference carbon-based hybrid negative electrode including a carbon based negative electrode active material and a non-carbon based negative electrode active material using an X-ray diffractometer, and plotting a graph of changes in lattice d-spacing value as a function of charge/discharge capacity (X axis); and calculating a reference slope difference corresponding to a difference in slope value changed with respect to the inflection point of the graph during discharging in the plotted graph.

In the plotted graph, during discharging, the discharge capacity after the inflection point of the graph may correspond to the capacity contribution of the non-carbon based negative electrode active material, and the discharge capacity before the inflection point may correspond to the capacity contribution of the carbon based negative electrode active material.

The target slope difference and the reference slope difference may be calculated by the following equation.

Target slope difference=Absolute value of [(the slope of the graph before the inflection point in the graph of the target secondary battery)-(the slope of the graph after the inflection point in the graph of the target secondary battery)]

Reference slope difference=Absolute value of [(the slope of the graph before the inflection point in the graph of the reference secondary battery)-(the slope of the graph after the inflection point in the graph of the reference secondary battery)]

For example, when the slope of the graph before the inflection point in the graph of the target secondary battery is −2 and the slope of the graph after the inflection point in the graph of the target secondary battery is 0, the target slope difference is the absolute value of [(−2)–(0)], which equals 2.

Meanwhile, when the slope of the graph before the inflection point in the graph of the reference secondary battery is −2 and the slope of the graph after the inflection point in the graph of the reference secondary battery is −1, the reference slope difference is the absolute value of [(−2)–(−1)] which equals 1.

Subsequently, prediction if the cycle life of the target secondary battery is improved compared to the reference secondary battery is performed from a result of the comparison.

Specifically, according to an embodiment of the present disclosure, an inflection point at which the slope changes from a large value to a small value at the late stage of discharge may be detected in the lattice d-spacing decreasing curve as a function of the discharge capacity of the reference secondary battery and the target secondary battery comprising the carbon-based hybrid negative electrode, and the C-rate applied to the carbon based negative electrode active material in the hybrid negative electrode may be determined according to the change of the slope (a slope difference) with respect to the inflection point.

In this instance, prediction whether the cycle life of the target secondary battery is improved or degraded compared to the reference secondary battery may be performed by comparing a reference slope difference corresponding to a difference in slope value changed with respect to the inflection point in the graph showing changes in lattice d-spacing value as a function of charge/discharge capacity (X axis) of the reference secondary battery with a target slope difference corresponding to a difference in slope value changed with respect to the inflection point in the graph showing changes in lattice d-spacing value as a function of charge/discharge capacity (X axis) of the target secondary battery.

When the target slope difference of the target secondary battery is much larger than the reference slope difference of the reference secondary battery, there may be a plateau range where the lattice d-spacing decreasing slope with changes in capacity at the late stage of discharge after the inflection point in the graph of the target secondary battery is much smaller than that before the inflection point. In the plateau range, there is no or little change in lattice d-spacing of the carbon based material, but the capacity changes, thus stress applied to the carbon based material may be minimized due to a very low delithiation rate from the carbon based material.

When stress applied to the carbon based material of the target secondary battery is smaller than the reference secondary battery, it may be predicted that the cycle life of the target secondary battery is improved compared to the reference secondary battery.

Accordingly, when the target slope difference is larger than the reference slope difference from a result of the comparison, it may be determined that the cycle life of the target secondary battery is improved compared to the reference secondary battery.

On the contrary, when the target slope difference is smaller than the reference slope difference from a result of the comparison, it may be determined that the cycle life of the target secondary battery is degraded compared to the reference secondary battery. In this case, stress applied to the carbon based material of the target secondary battery is higher than that of the reference secondary battery, and thus it may be predicted that the cycle life of the target secondary battery is degraded compared to the reference secondary battery.

Hereinafter, to help the understanding of the present disclosure, the present disclosure will be described in detail through the following preparation examples and experimental examples. However, the preparation examples and experimental examples according to an embodiment of the present disclosure may be modified in many different forms, and the scope of the present disclosure should not be interpreted as being limited to the following preparation examples and experimental examples. The preparation examples and experimental examples of the present disclosure are provided to help those having ordinary skill in the art to understand the present disclosure fully and completely.

Preparation Example 1—Sample A (Reference Secondary Battery)

<Preparation of Negative Electrode>

A mixture of a mixed negative electrode active material of artificial graphite as a carbon based active material and silicon oxide (SiO) having Coulombic efficiency of 80% or more at 0.1 C charge/discharge as a non-carbon based active material, a binder polymer (styrene-butadiene rubber (SBR) and carboxymethyl cellulose (CMC)) and carbon black as a conductive material at a weight ratio of 95:3.5:1.5 is mixed with water as a dispersion medium at a weight ratio of 1:2 to prepare an active material layer slurry. In this instance, the weight of SiO is 5 weight % based on the total weight of the mixed negative electrode active material of artificial graphite and SiO and a weight ratio of the styrene-butadiene rubber (SBR) and the carboxymethyl cellulose (CMC) is 2.3:1.2.

Using a slot die, the active material layer slurry is coated on one surface of a copper (Cu) film as a 10 µm thick negative electrode current collector, and dried under 130° C. vacuum for 1 hour to form an active material layer on the copper film.

The active material layer is roll pressed to prepare a negative electrode having 80 µm thick active material layer of single layer structure. In this instance, a loading amount is 17 mg/cm² based on the dry weight of the negative electrode active material layer.

<Preparation of Positive Electrode>

Li(Ni$_{0.8}$Mn$_{0.1}$Co$_{0.1}$)O$_2$(NCM-811) as a positive electrode active material, carbon black as a conductive material and polyvinylidene fluoride (PVdF) as a binder are added to N-methylpyrrolidone (NMP) as a solvent at a weight ratio of 96:2:2 to prepare a positive electrode active material slurry. The slurry is coated on one surface of a 15 µm thick aluminum current collector, and dried and pressed in the same condition as the negative electrode to prepare a positive electrode. In this instance, a loading amount is 20 mg/cm² based on the dry weight of the positive electrode active material layer.

<Preparation of Lithium Secondary Battery>

LiPF$_6$ is dissolved in an organic solvent of ethylene carbonate (EC), propylenecarbonate (PC) and ethylmethyl carbonate (EMC) mixed at a volume ratio of 3:1:6 such that the concentration is 1.0M to prepare a nonaqueous electrolyte solution.

A polyolefin separator is interposed between the positive electrode and the negative electrode prepared as above, and the electrolyte solution is injected to prepare a lithium secondary battery (sample A, reference secondary battery).

Preparation Example 2—Sample B (Target Secondary Battery)

<Preparation of Negative Electrode>

A mixture of artificial graphite as a carbon based active material, a binder polymer (styrene-butadiene rubber (SBR) and carboxymethyl cellulose (CMC)) and carbon black as a conductive material at a weight ratio of 95:3.5:1.5 is mixed with water as a dispersion medium at a weight ratio of 1:2 to prepare a first active material layer slurry. In this instance, a weight ratio of the styrene-butadiene rubber (SBR) and the carboxymethyl cellulose (CMC) is 2.3:1.2.

A second active material layer slurry is prepared by the same method as the first active material layer slurry, except that instead of artificial graphite, a non-carbon based active material, silicon oxide (SiO) having Coulombic efficiency of 80% or more at 0.1 C charge/discharge is used, and the SiO is included in an amount of 5 weight % based on the total weight of artificial graphite and SiO.

Using a dual slot die, the first active material layer slurry is coated on one surface of a copper (Cu) film as a 10 µm thick negative electrode current collector, and subsequently the second active material layer slurry is coated on the first active material layer slurry and dried under 130° C. vacuum for 1 hour to form a first active material layer and a second active material layer on the copper film.

The first active material layer and the second active material layer are roll pressed at the same time to prepare a negative electrode having a 80 µm thick double layered active material layer. A loading amount is 17 mg/cm² based on the dry weight of the negative electrode active material layer.

<Preparation of Positive Electrode>

A positive electrode is prepared by the same method as preparation example 1.

<Preparation of Lithium Secondary Battery>

A nonaqueous electrolyte solution is prepared by the same method as preparation example 1.

A polyolefin separator is interposed between the positive electrode and the negative electrode prepared as above, and the electrolyte solution is injected to prepare a lithium secondary battery (sample B, target secondary battery).

EXPERIMENTAL EXAMPLE

Experimental Example 1

During the charge/discharge of the secondary batteries of preparation examples 1 and 2 in the same condition as cycle testing, 0.33 CC/CV charge, 0.33 CC discharge, using the transmission x-ray diffractometer (Manufacturer: Bruker, Trade name: D8 Advance), scanning is performed while tracking (002) lattice interface peak (2θ=7.5~11 (Ag λ=0.56)) of artificial graphite included in the negative electrode of each secondary battery. The lattice d-spacing of artificial graphite is calculated by fitting (002) lattice interface peak of artificial graphite included in the negative electrodes of preparation examples 1 to 2 obtained by scanning based on the Bragg's Law.

Figure 1B:
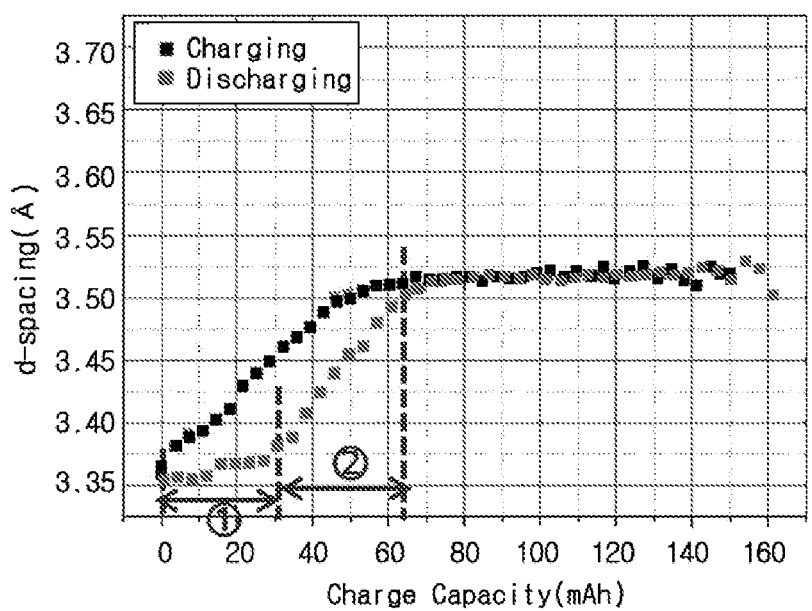

FIGS. 1a and 1b are graphs showing the results of observing in real time changes in lattice d-spacing of artificial graphite included in each negative electrode with changes in capacity during charging/discharging of sample A (the reference secondary battery) of preparation example 1 and sample B (the target secondary battery) of preparation example 2.

Referring to FIGS. 1a and 1b, in the graph curve during discharging of sample A (the reference secondary battery) and sample B (the target secondary battery), all the discharge capacity has an inflection point at which the slope of the curve rapidly changes at about 30 mAh. In the higher capacity range than the capacity at the inflection point (at the early stage of discharge), changes in graphite lattice is very large with changes in capacity, and the discharge capacity at that time is attributed to delithiation of lithium ions in graphite.

In the case of the reference secondary battery of preparation example 1 of FIG. 1a, the lattice d-spacing decreasing slope is smaller at the late stage of discharge with respect to the inflection point than at the early stage of discharge, but there is no rapid slope change as much as the target secondary battery shown in FIG. 1B. That is, it can be seen that the target slope difference is larger than the reference slope difference.

In the case of FIG. 1B, in the lower capacity range than the capacity of the inflection point (at the late stage of discharge), i.e., the discharge capacity range of about 30 to 0 mAh, there is no or little change in graphite lattice d-spacing, but the capacity changes. At the late stage of discharge, delithiation of lithium ions lithiated in SiO takes place, not delithiation of lithium ions in graphite.

Specifically, as shown in FIG. 1a, in the case of the reference secondary battery (sample A) of preparation example 1 comprising the hybrid negative electrode of single layer structure in which the carbon based negative electrode active material and the non-carbon based negative electrode active material are uniformly mixed, the lattice d-spacing change slope shows a rapid decrease in the range ② and a smaller slope than the slope of the range ② when entering the range ① at the late stage of discharge, and delithiation of lithium ions takes place at a constant rate.

In contrast, in the target secondary battery (sample B) of preparation example 2 comprising the hybrid negative electrode of double layer structure in which the carbon based negative electrode active material layer and the non-carbon based negative electrode active material layer are completely separated as shown in FIG. 1b, a clear plateau (step reaction) is observed in the range ①. In the range ② of FIG. 1b, all lithium ions remaining in artificial graphite as the carbon based negative electrode active material move out during delithiation, and in the range ①, and is shifted to the reaction range in which lithium ions are only delithiated in the non-carbon based negative electrode active material (for example, SiO). Since the reaction takes place stepwise from the range ② to the range ①, the plateau may be referred to as "step reaction".

Specifically, it may be interpreted that when considering the data measurement interval is 4 min per point in FIG. 1b, the discharge capacity constantly increases for about 20 to 25 min in the range ① at the late stage of discharge, but the lattice d-spacing of artificial graphite does not change, and in the hybrid negative electrode system of sample B, delithiation of lithium ions occurs in the non-carbon based negative electrode active material earlier than artificial graphite as the carbon based negative electrode active material. It will be expected to relieve the structural stress related to the volume expansion of artificial graphite.

As a result, as described above, it can be seen that the target slope difference of the target secondary battery (sample B) is larger than the reference slope difference of the reference secondary battery (sample A), and it may be predicted that the target secondary battery (sample B) in which lower stress is applied to artificial graphite has a longer cycle life than the reference secondary battery (sample A).

Experimental Example 2

To see if the cycle life predicted in experimental example 1 matches the actual result, cycle life testing is performed by charging and discharging the reference secondary battery (sample A) of preparation example 1 and the target secondary battery (sample B) of preparation example 2 under the same condition as the cycle test, 0.33 CC/CV charge and 0.33 CC discharge conditions for 200 cycles.

Figure 2:
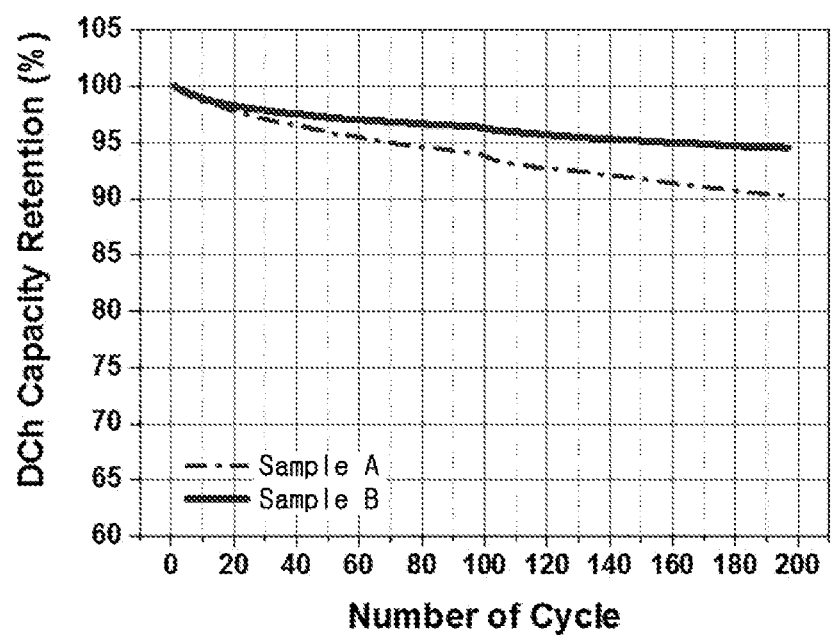
FIG. 2 is a graph showing the cycle life results of sample A (a reference secondary battery) of preparation example 1 and sample B (a target secondary battery) of preparation example 2.

FIG. 2 is a graph showing the cycle life results of sample A of preparation example 1 (the reference secondary battery) and sample B of preparation example 2 (the target secondary battery).

Referring to FIG. 2, it can be seen that compared to the reference secondary battery (sample A) in which plateau is not observed in experimental example 1, the target secondary battery (sample B) comprising the negative electrode showing the plateau from about 20 to 25 min has superior discharge capacity retention in terms of the cycle life for initial 200 cycles.

What is claimed is:

1. A method of predicting cycle life of a secondary battery comprising a carbon-based hybrid negative electrode, the method comprising:
   charging/discharging a target secondary battery comprising a carbon-based hybrid negative electrode including a carbon based negative electrode active material and a non-carbon based negative electrode active material in order to measure a lattice d-spacing of the carbon based negative electrode active material of the target carbon-based hybrid negative electrode using an X-ray diffractometer during the charging/discharging, and using the measurement to plot a graph of changes in a lattice d-spacing value as a function of charge/discharge capacity (X axis) of the target secondary battery;
   calculating a target slope difference corresponding to a difference in slope value changed with respect to an inflection point of the graph during discharging in the plotted graph;
   comparing the target slope difference with a reference slope difference corresponding to a difference in the slope value changed with respect to an inflection point in a graph showing changes in a lattice d-spacing value as a function of charge/discharge capacity (X axis) of a reference secondary battery;
   predicting whether cycle life of the target secondary battery is improved compared to the reference secondary battery from a result of the comparison using the target slope difference of the target secondary battery being larger than the reference slope difference of the reference secondary battery, and determining that the target secondary battery in which a lower stress is applied to an artificial graphite has a longer cycle life than the reference secondary battery based on the target slope difference that is larger; and
   using the target secondary battery as a power source based on the cycle life of the target secondary battery compared to the reference secondary battery when the target slope difference is larger than the reference slope difference from the result of the comparison to confirm a prediction from the predicting.

2. The method of predicting cycle life of a secondary battery according to claim 1, wherein the reference slope difference is obtained by measuring the lattice d-spacing of the carbon based negative electrode active material of the reference carbon-based hybrid negative electrode using the X-ray diffractometer during the charging/discharging of the reference secondary battery comprising the reference carbon-based hybrid negative electrode comprising the carbon based negative electrode active material and the non-carbon based negative electrode active material, and plotting the graph of changes in the lattice d-spacing value as the function of charge/discharge capacity (X axis) of the reference secondary battery; and
   calculating the reference slope difference corresponding to the difference in slope value changed with respect to the inflection point of the graph during discharging in the plotted graph.

3. The method of predicting cycle life of a secondary battery according to claim 1, wherein the discharge capacity after the inflection point of the graph during discharging in the plotted graph corresponds to capacity contribution of the non-carbon based negative electrode active material, and discharge capacity before the inflection point corresponds to capacity contribution of the carbon based negative electrode active material.

4. The method of predicting cycle life of a secondary battery according to claim 1, wherein the target slope difference and the reference slope difference are calculated by the following equation:

Target slope difference=Absolute value of [(the slope of the graph before the inflection point in the graph of the target secondary battery)−(the slope of the graph after the inflection point in the graph of the target secondary battery)]

Reference slope difference=Absolute value of [(the slope of the graph before the inflection point in the graph of the reference secondary battery)−(the slope of the graph after the inflection point in the graph of the reference secondary battery)].

5. The method of predicting cycle life of a secondary battery according to claim 1, further comprising generating a determination that the cycle life of the target secondary battery is degraded compared to the reference secondary battery when the target slope difference is smaller than the reference slope difference from the result of the comparison to confirm the prediction from the predicting.

6. The method of predicting cycle life of a secondary battery according to claim 1, wherein the carbon based negative electrode active material comprises at least one of natural graphite, artificial graphite, soft carbon, hard carbon, pitch carbide, sintered cokes, graphene, or carbon nano tubes.

7. The method of predicting cycle life of a secondary battery according to claim 1, wherein the non-carbon based negative electrode active material comprises a metal or metalloid that can form an alloy with lithium.

8. The method of predicting cycle life of a secondary battery according to claim 1, wherein the non-carbon based negative electrode active material comprises a metal or metalloid selected from Si, Sn, In, Pb, Ga, Ge, Al, Bi, Sb, Ag, Mg, Zn, Pt, Ti or a combination thereof; their oxide; their carbon composite; a carbon composite of the metal or metalloid oxide; or a mixture thereof.

9. The method of predicting cycle life of a secondary battery according to claim 1, wherein the non-carbon based negative electrode active material comprises Si, $SiO_x$ (0<x<2), or a mixture thereof.

10. The method of predicting cycle life of a secondary battery according to claim 1, further comprising:
    detecting a level of stress applied to the carbon based negative electrode active material including the artificial graphite; and
    generating another prediction that the cycle life of the target secondary battery is improved compared to the reference secondary battery when the level of stress applied to the carbon based negative electrode active material of the target secondary battery is smaller than the reference secondary battery so that the level of stress applied to the carbon based negative electrode active material is minimized due to a lower delithiation rate resulting from the carbon based negative electrode active material.

11. The method of predicting cycle life of a secondary battery according to claim 1, wherein the charging/discharging of a target secondary battery further includes:
    performing an operando analysis during the charge/discharge of the target secondary battery to directly observe a behavior of a carbon based material and a non-carbon based material of the target carbon-based hybrid negative electrode by a non-destructive analysis of the target secondary battery using the X-ray diffractometry.

* * * * *